United States Patent [19]

Jordan

[11] Patent Number: 5,261,968
[45] Date of Patent: Nov. 16, 1993

[54] PHOTOVOLTAIC CELL AND METHOD
[75] Inventor: John F. Jordan, El Paso, Tex.
[73] Assignee: Photon Energy, Inc., Golden, Colo.
[21] Appl. No.: 819,281
[22] Filed: Jan. 13, 1992
[51] Int. Cl.$^5$ ............... H01L 31/042; H01L 31/18; H01L 31/072; H01L 31/0368
[52] U.S. Cl. .................... 136/244; 136/258; 136/260; 136/264; 136/256; 257/184; 437/4; 437/5
[58] Field of Search ................ 437/4–5; 136/244, 258 PC, 260, 261, 264–265; 357/30 B, 30 E, 30 F, 30 H, 30 J, 30 K, 59 D, 61–63

[56] References Cited
U.S. PATENT DOCUMENTS

| | | | |
|---|---|---|---|
| 4,178,395 | 12/1979 | Jordan et al. | 427/74 |
| 4,251,286 | 2/1981 | Barnett | 136/260 |
| 4,362,896 | 12/1982 | Singh | 136/258 |
| 4,568,792 | 2/1986 | Mooney et al. | 136/260 |
| 4,598,306 | 7/1986 | Nath et al. | 257/458 |
| 4,611,091 | 9/1986 | Choudary et al. | 136/260 |
| 4,650,921 | 3/1987 | Mitchell | 136/258 |
| 4,705,911 | 11/1987 | Nakano et al. | 136/251 |
| 4,735,909 | 4/1988 | Albright et al. | 437/4 |
| 5,078,803 | 1/1992 | Pier et al. | 136/256 |
| 5,078,804 | 1/1992 | Chen et al. | 136/260 |

OTHER PUBLICATIONS

K. W. Mitchell et al., *Conference Record, 18th IEEE Photovoltaic Specialists Conference*, (1985), pp. 1359–1364.
"Properties of Screen-Printed and Sintered CdTe Film Formed on a CdS Sintered Film", *Technical Digest of the International PVSEC-3*, 1987, by Matsumoto et al., pp. 695–698.
"Effect of Resistivity of CdS Sintered Film on Photovoltaic Properties of Screen-Printed CdS/CdTe Solar Cell", *Japanese Journal of Applied Physics*, vol. 22, Dec. 1983, by Uda et al., pp. 1832–1836.
"Preparation of Low Resistance Contact Electrode in Screen Printed CdS/CdTe Solar Cell", *Japanese Journal of Applied Physics*, vol. 22, Dec. 1983, by Kuribayashi et al., pp. 1828–1831.
"Screen Printed Thin Film CdS/CdTe Solar Cell", *Japanese Journal of Applied Physics*, vol. 19, Apr. 1980, by Nakayama et al., pp. 703–712.
"All Screen Printed CdS/CdTe Solar Cell", *IEEE Photovoltaic Specialists Conf.*, (1982), by Uda et al., pp. 801–804.

(List continued on next page.)

Primary Examiner—Aaron Weisstuch
Attorney, Agent, or Firm—Sheridan, Ross & McIntosh

[57] ABSTRACT

An improved photovoltaic panel and method of forming a photovoltaic panel are disclosed for producing a high efficiency CdS/CdTe photovoltaic cell. The photovoltaic panel of the present invention is initially formed with a substantially thick CdS layer, and the effective thickness of the CdS layer is substantially reduced during regrowth to both form large diameter CdTe crystals and substantially reduce the effective thickness of the CdS layer by diffusion into the CdTe layer such that a majority of sunlight having a wavelength less than 520 nm passes through the CdS layer to the photovoltaic junction. Shorting of individual cells is substantially minimized by providing a conductive layer which is formed from two tin oxide layers, each having substantially dissimilar electrical conductivity, such that an electrically-conductive tin oxide layer interconnects the plurality of photovoltaic cells, while the comparatively high resistivity tin oxide layer prevents shorting of a cell. The electron density of the high resistivity tin oxide layer may be adjusted to be within a magnitude of approximately three orders of the presumed electron density of the CdTe layer, such that a energy-producing junction is formed in any area of flaws in the CdS layer by the CdTe layer and tin oxide layer. The photovoltaic panel of the present invention has a low material and manufacturing cost, yet produces a surprisingly high efficiency to produce a low cost per output watt photovoltaic panel.

25 Claims, 2 Drawing Sheets

OTHER PUBLICATIONS

"Optical Energy Gap of the Mixed Crystal CdSTe", *Japan. J. Appl. Phys.*, vol. 12, 1973, by Ohata et al., pp. 1641–1642.

"Stability of Screen Printed CdS/CdTe Solar Cells", *Japanese Journal of Applied Physics*, vol. 22, Dec. 1983, by Uda et al., pp. 1822–1827.

"CdS/CdTe Solar Cells by the Screen-Printing-Sintering Technique", IEEE Photovoltaic Specialists Conference, 1990, by Suyama et al., pp. 498–503.

"Preparation and Photoconductive Properties of Sintered Films of CdS–CdTe Mixed Crystals", *Phys. Stat. Soc. A.*, vol. 39, 1977, by Saraie et al., pp. 331–336.

"Electrical and Microstructural Properties of Screen-printed CdS Layers for CdS–CdTe Solar Cells", IEEE Photovoltaic Specialists Conference, 1988, by Clemminck et al., pp. 1585–1589.

"Progress Towards High Efficiency, Thin Film CdTe Solar Cells", IEEE Photovoltaic Specialists Conference, 1985, by Mitchell et al., pp. 1359–1364.

S. Ikegami, *Solar Cells*, vol. 23, pp. 89–105 (1988).

PHOTOVOLTAIC CELL AND METHOD

FIELD OF THE INVENTION

The present invention relates to low cost photovoltaic devices and, more particularly, relates to improvements in polycrystalline photovoltaic cells and methods of manufacturing such cells which enable the n-type layer of the photovoltaic junction to be highly transmissive of low wavelength energy, therefore increasing the efficiency of the photovoltaic device.

BACKGROUND OF THE INVENTION

Photovoltaic cells capable of converting sunlight directly to electrical energy have been commonly used for decades. Most present-day photovoltaic devices employ single cells, which are satisfactory for low energy consumption devices, but inherently have a high cost/output watt ratio. Polycrystalline photovoltaic cells can be manufactured at a much lower cost than single crystal cells, but have generally reduced efficiencies. Nevertheless, a great deal of research has been and is continuing with respect to the development of higher efficiency polycrystalline photovoltaic products which utilize thin layers of particular chemical compositives to form the n-type material and the p-type material of the photovoltaic junction. Much of this technology has detracted from the advantages of low cost in favor of increased efficiency. While high efficiency is obviously desired, low material and manufacturing costs are critical if photovoltaic technology is to have increased practical significance. Low cost polycrystalline cells can currently provide relatively low cost electrical power at remote locations, such as telecommunication stations, agricultural water pumping sites, remote villages and portable housing facilities. Improvements in such technology may well result in future photovoltaic power plants which compete with conventional hydrocarbon consuming plants. The present invention is directed to such polycrystalline photovoltaic technology and, most importantly, is directed to improvements in photovoltaic technology which will result in increased efficiency but do not significantly increase the material or manufacturing costs of the photovoltaic cells.

A low cost photovoltaic cell with a p-type $Cu_xS$ layer and an n-type CdS layer disclosed in U.S. Pat. Nos. 3,902,920 and 4,086,101. Such a cell may be formed on a glass substrate according to the techniques disclosed in U.S. Pat. No. 3,959,565. Improved CdS film for such a cell is the subject of U.S. Pat. No. 4,095,006, and residual chlorides in a CdS layer are disclosed in U.S. Pat. No. 4,178,395. The n-type and/or the p-type polycrystalline layers of the photovoltaic cell may be regrown as disclosed in U.S. Pat. No. 4,362,896. Improved equipment for forming such a low cost cell is disclosed in U.S. Pat. Nos. 4,224,355, 4,239,809, 4,338,078 and 4,414,252. Instead of utilizing a spray pyrolysis technique, the n-type polycrystalline layer or the p-type polycrystalline layer may be formed according to a technique which utilizes compression preceding regrowth, as disclosed in U.S. Pat. No. 4,735,909. After the various polycrystalline layers have been formed on a substrate, individual cells may be formed and interconnected in a series arrangement according to U.S. Pat. Nos. 4,243,432 and 4,313,022. Various cell or panel encapsulation techniques have been devised, and a low cost yet reliable panel encapsulation technique is disclosed in U.S. Pat. No. 5,022,930. The series connected cells on a glass substrate form a photovoltaic panel, and various photovoltaic panels may be assembled in a module according to the techniques of U.S. Pat. No. 4,233,085.

Various materials have been suggested for forming the junction layers of the polycrystalline photovoltaic cell. A great deal of research has been expended with respect to polycrystalline silicon photovoltaic cells, in part because early tests resulted in reasonably high efficiency for these cells. Copper indium diselenide polycrystalline cells have been developed, and show some promise of improved efficiencies. Cadmium telluride cells, and particularly such cells wherein the cadmium telluride is the p-type material, nevertheless are generally considered to offer the lowest cost production potential. It must be recognized, of course, that the commercial cost of a photovoltaic cell does not only consist of the material and manufacturing cost of active junction layers which convert sunlight into electrical energy, since the material and manufacturing costs of the substrate, the appropriate electrode configuration of the cells and for interconnecting the cells, and the encapsulation mechanism must all be considered in analyzing the overall cost of the photovoltaic product. The ideal solution to one problem, i.e., high efficiency and low cost junction formation, must also be compatible with the technology used to achieve a desired overall photovoltaic product at the desired cost/output ratio.

Cadmium telluride photovoltaic cells offer an advantage of relatively low costs. Moreover, cadmium telluride cells may be manufactured with low-cost deposition equipment for applying the CdTe film layer, as described in the previously-referenced patents, and this cell does not require extremely close quality control to obtain reasonable efficiency. Various materials have been proposed for the n-type layer for forming the photovoltaic junction with the cadmium telluride layer. Cadmium sulfide has been considered a suitable n-type material for such a cell, and particularly for a low cost cadmium telluride cell, since it also has a relatively low manufacturing cost and may be deposited at atmospheric pressure utilizing low-cost deposition equipment. U.S. Pat. No. 4,568,792 discloses various types of cadmium telluride cells, and notes that CdS is an advantageous n-type material because of its wide band gap. Various materials have been suggested for "doping" the p-type cadmium telluride layer, while the n-type layer may be oppositely doped. U.S. Pat. No. 4,705,911 discloses a CdS/CdTe solar cell, wherein an oxygen-releasing agent is provided to minimize reduction of the p-type characteristics of the cadmium telluride.

In spite of its low-cost per watt of useful power output, CdS/CdTe cells have not been widely accepted because of continuing relatively poor efficiency. One long-recognized reason for such poor efficiency relates to the construction of the cells and the optical band gap of the CdS layer. To produce electrical energy, light must reach the junction of the cell, i.e., the CdS/CdTe interface. The CdTe layer generally serves as the light absorber, and in a typical structure the CdS serves as a heterojunction partner and an optically transmissive layer. This design may result in a "backwall" cell, wherein light passes through a CdS layer which is deposited on the CdTe layer, which was previously deposited on an opaque substrate. Alternatively, an "inverted backwall" design may be used, wherein light first passes through a highly-transmissive substrate (glass) then through the CdS layer which was deposited over the substrate, to reach the junction formed when the CdTe layer is deposited on the CdS layer. A "front wall" cell may be formed utilizing a CdS/CdTe design, wherein the CdTe layer is deposited over a CdS layer, which was previously deposited on an opaque substrate, or an inverted "front wall" cell formed by depositing the CdTe layer on a glass substrate, with the CdS layer then applied on the CdTe layer. While the backwall or inverted backwall design of a CdS/CdTe cell is preferred, a significant quantity of energy is lost in the CdS layer, since cadmium sulfide does not pass optical energy with a wavelength shorter than approximately 520 nm unless the film is very thin. The CdS layer must be continuous to provide the desired junction and, most importantly, to prevent shorts to the electrode layer. To utilize the desired low-cost deposition equipment, the CdS layer has necessarily been of a thickness such that very little of the optical energy with wavelengths less than 520 nm reached the junction and produced useful energy. U.S. Pat. No. 4,251,286 discloses utilizing a zinc sulfide blocking layer to prevent electrical shorts, but this technique is expensive and introduces additional complexities which are believed to have a significant adverse affect on the life of the cell. U.S. Pat. No. 4,598,306 also discloses the use of a barrier layer for preventing electrical shorts between the active photovoltaic layers and an electrode. The barrier layer operates as a series resistor to limit current flow through the otherwise short circuit current path. U.S. Pat. No. 4,544,797 discloses another technique for preventing short circuits by passivating areas of a first conductive electrical contact which are not covered by the adjoining n-type or p-type material. This passivating step may be performed by immersing the device in ammonium sulfide to convert a silver metallic layer at the location of pinholes to an n-conductive $Ag_2S$ material. This procedure is similarly costly and again introduces additional chemicals into the cell formation process which are not desired. An article entitled "Properties of the Screen-Printed and Sintered CdTe Film Formed on a CdS Sintered Film" in *Technical Digest of the International PVSEC*, Vol. B-III (1987), p. 5 suggests that screen-printed CdS/CdTe cells may have improved longer wavelength sensitivity due to the formation of mixed $CdS_xTe_{1-x}$ crystals during sintering of the CdTe.

The disadvantages of the prior art are overcome by the present invention, and an improved photovoltaic cell and method of forming a photovoltaic cell are hereinafter disclosed. A photovoltaic panel comprising a plurality of cells formed according to the techniques of the present invention has the desirable benefit of low material and manufacturing costs, yet produces a considerable increase in photovoltaic conversion efficiency compared to prior art devices which have not included this technology, thereby resulting in a photovoltaic panel having relatively low overall cost per watt of useful power output.

SUMMARY OF THE INVENTION

A high efficiency CdS/CdTe photovoltaic cell may be formed according to the present invention. A continuous relatively thick CdS layer is initially formed on a substrate, but its thickness is reduced during regrowth of the active photovoltaic layers. At the regrowth temperature, CdS diffuses or migrates into either the space between the formed large CdTe crystals or into the crystals themselves, resulting in a continuous CdS layer, yet a CdS layer having a reduced effective thickness. The effective thickness of the resulting CdS layer may be in the range of approximately 100 Å to approximately 500 Å, so that a high percentage of optical energy less than 520 nm passes through the CdS layer to the junction, thereby increasing efficiency.

Special precautions are taken to ensure that the CdTe layer does not provide a significant shunting path to the conductive layer adjoining the CdS layer, while at the same time ensuring that the conductive layer is highly transmissive of light. This conductive layer preferably comprises one highly-conductive layer of tin oxide (approximately $10^{20}$ carrier per $cm^3$), and another substantially lower conductivity layer adjoining the CdS layer. This second lower conductivity tin oxide layer has its carrier concentration adjusted so that when in contact with CdTe (where there are flaws in the CdS layer), a voltage and current are produced and shunting is avoided. The highly conductive tin oxide layer provides the desired low resistance path for the transmission of electrical energy within and between cells. A high degree of continuity of the low conductivity tin oxide layer is essential if there are a significant number of flaws in the CdS layer, and the desired uniformity of this tin oxide layer may be obtained by spraying a low molarity tin oxide solution for a long enough time so that a large number of droplets provide uniform statistical coverage of the high conductivity tin oxide layer. The conductivity of tin oxide may be easily varied in the range of at least six orders of magnitude.

According to one embodiment of the present invention, a high efficiency CdS/CdTe backwall photovoltaic panel is formed by first spraying a high conductivity tin oxide layer on a glass substrate utilizing spray pyrolysis to obtain a layer with a specific conductivity in the range of from 1000 to 5000 mho/cm. The low conductivity second tin oxide layer is then applied by the same technique using a low molarity solution suitably doped to obtain a desired carrier concentration in the resulting film. In an exemplary case, a conductivity of approximately 0.10 mho/cm with a carrier concentration of $4 \times 10^{17}$ carriers/$cm^3$ is used, with a CdTe layer having a carrier concentration of $5 \times 10^{15}$ carriers/$cm^3$ to produce a satisfactory photovoltaic cell. In this case, cadmium was used as the tin oxide dopant, but zinc or other metals may be used. It should be pointed out that the carrier concentration, while related to conductivity, is not a direct function of it but is related in part to the dopant used and resulting mobility. Conductivity measurements are expressed in this application because carrier concentration is difficult to measure. The CdS layer may then be applied by spray pyrolysis (or other suitable technique) to an initial thickness in the range of from 2,000 to 12,000 Å, and a substantially thick CdTe layer applied by an atmospheric temperature spraying and compression technique (or similar method). The panel is then heat treated and the active photovoltaic layers regrown at approximately 540° C. to form large CdTe crystals, while the CdS diffuses or migrates between or into these crystals and forms a layer having an effective thickness in the range of approximately 1/20th of its initial thickness. The panel is then divided into cells and the cells series interconnected, and the completed panel encapsulated. The active areas of a photovoltaic panel have a comparatively high efficiency up to 18% over a long cell life, in large part due to the increased efficiency attributable to the effectively thin CdS layer. The quantum efficiency of the cell in the spectral band at wavelengths shorter than 520 nm may surprisingly be approximately 90%. The tin oxide layer, with an appropriate carrier concentration, in combination with a suitable p-type material layer, will produce voltage and current when exposed to sunlight where there are flaws in the CdS layer.

It is an object of the present invention to provide a substantially high efficiency polycrystalline photovoltaic cell, wherein the n-type material layer of the photovoltaic junction is made highly transmissive to short wavelength energy by reducing the effective thickness of the n-type material layer by diffusing or interdiffusing into or with the p-type layer a substantial portion of this layer.

It is a further object of the present invention to reduce the effective thickness of the n-type material layer in a photovoltaic cell to approximately 1/20th of its applied effective thickness, thereby forming a substantially continuous, reduced thickness layer for increased short wavelength light transmissivity.

A major object of this invention is to provide a polycrystalline cell with a relatively thin yet continuous n-type material layer, and with a relatively low conductivity and doped layer adjacent the n-type material layer, and a high conductivity conductor layer adjacent to the low conductivity layer and formed from substantially the same base material as the low conductivity layer, such that any flaws in the n-type material layer do not allow a short between the p-type material layer and the low conductivity layer, but rather actually produce energy in the area of any flaws in the n-type layer by the proper adjustment of the relative carrier density of the low conductivity layer and the p-type material layer.

It is a feature of the present invention to provide a high efficiency CdS/CdTe photovoltaic cell, wherein the effective thickness of the applied CdS layer is significantly reduced by diffusion or migration into the CdTe layer, thereby reducing the effective thickness of the CdS layer to allow a high percentage of short wavelength light to reach the CdS/CdTe junction.

It is a further feature of this invention to utilize low cost techniques to apply a uniform and continuous CdS layer, and to substantially reduce the thickness of the applied layer to obtain a desired relatively thin CdS layer.

Yet another feature of the present invention is to regrow the CdS/CdTe photovoltaic layers at a temperature in excess of approximately 400° C., such that relatively large CdTe crystals are obtained while a significant portion of the CdS layer migrates or diffuses between or into the CdTe crystals to substantially reduce the effective thickness of the CdS layer.

Still another feature of this invention is to provide a CdS/CdTe photovoltaic cell with a tin oxide conductive layer comprising a relatively low conductivity tin oxide layer adjoining the CdS layer, and a high conductivity tin oxide layer adjoining the low conductivity layer.

It is still another feature of the invention that the carrier density of the high resistivity tin oxide layer is adjusted to be compatible with the CdTe layer to form an energy producing junction in areas where the CdS layer contains flaws.

It is a significant feature of the present invention that the material and equipment costs of applying the required layers of the photovoltaic cell are substantially reduced compared to prior art manufacturing techniques, resulting in high efficiency photovoltaic devices.

It is an advantage of the present invention that the techniques for effectively reducing the desired effective thickness of the CdS layer and for minimizing or avoiding shunts and/or dead areas between the CdTe layer and the conductive layer adjoining the CdS layer may be used for various photovoltaic cell arrangements.

It is a further advantage of the present invention that various techniques may be used for applying the layers of the photovoltaic cell according to the present invention, thereby rendering the present invention suitable to spray pyrolysis, dip coating, gas deposition, and similar processes for applying relatively thin polycrystalline layers.

These and further objects, features, and advantages of the present invention will become apparent from the following detailed description, wherein reference is made to the figures in the accompanying drawings.

DETAILED DESCRIPTION OF PREFERRED EMBODIMENTS

Figure 1:
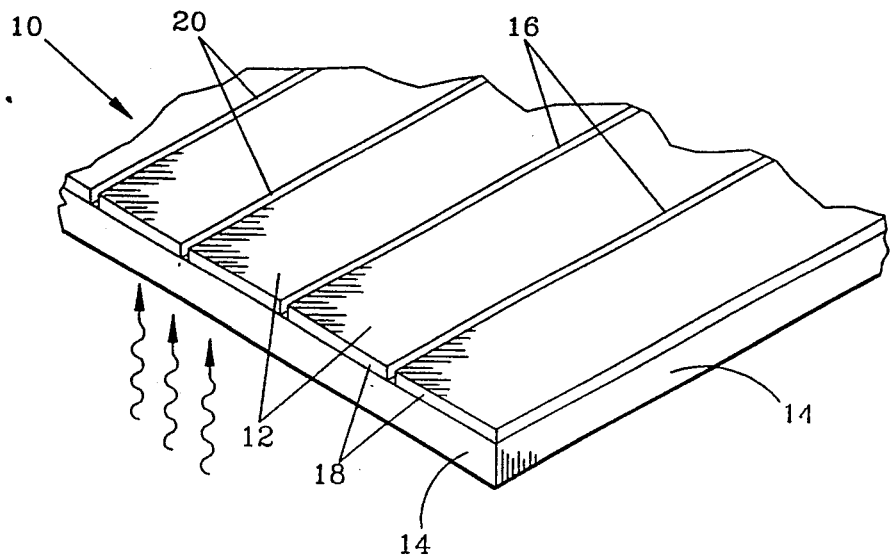
FIG. 1 is a pictorial view, partially in cross-section, of one embodiment of a photovoltaic panel formed according to the present invention which is not encapsulated.
Figure 3:
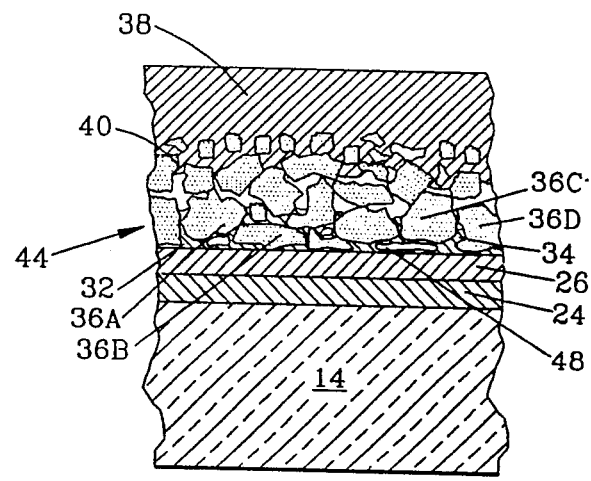
FIG. 3 is a cross-sectional view of the panel as shown in FIG. 2 subsequent to regrowth and prior to dividing and series interconnection.

FIG. 1 generally depicts a photovoltaic panel 10 including a plurality of photovoltaic cells 12 according to the present invention. The panel consists of relatively thin chemical layers 18 formed on a common vitreous substrate 14. Glass is preferred substrate due to its relatively low cost and its ideal flat surface for applying thin layers, and for subsequently heating those layers due to the low thermal expansion of the substrate. It should be understood that each of these applied layers, which are particularly shown in FIG. 3, are relatively thin to reduce material costs, and together will typically be less than 20 microns, so that the panel as shown in FIG. 1 visually appears to be little more than a rectangular sheet of glass with a thin painted coating. Also, it should be understood that the panel as shown in FIG. 1 may be complete in the sense that it is capable of producing electrical energy directly from sunlight. To maintain any form of resonable efficiency, however, the panel needs to be encapsulated to prevent water vapor-related degradation of the cells.

FIG. 1 depicts a backwall cell configuration, i.e., sunlight passes first through the glass substrate and then to the junction formed by the active photovoltaic layers. The panel as shown in FIG. 1 is thus turned over during typical outdoor use, so that the glass substrate 14 is above the layers 18. Nevertheless, the panel is formed with the glass as the base or substrate, and accordingly, the terms "top" or "upper" when referring to the layers discussed subsequently should be understood with respect to the substrate being beneath these layers. The techniques of the present invention are also applicable to manufacturing front wall photovoltaic cells, wherein sunlight is absorbed by the junction formed by a cadmium telluride absorber layer on top of the CdS window layer, so that light rays do not pass through the CdS layer.

The photovoltaic panel shown in FIG. 1 may be formed by successively applying thin, continuous layers of chemicals on a glass substrate. Individual cells are formed by making a series of elongate parallel cuts 20 through at least some of these layers to divide the panel into an elongate strips of cells according to the disclosure of U.S. Pat. No. 4,243,432. A layer or layers applied over the active photovoltaic layers also preferably provide the series interconnection of these cells to form the desired output voltage, and series interconnection strips 16 for accomplishing this purpose are generally depicted in FIG. 1. A suitable series interconnection configuration for electrically connecting cells is discussed subsequently. A suitable panel according to the present invention may thus be approximately 60 cm by 60 cm, and is capable of producing an output of approximately 50 watts with an incident isolation of approximately 1000 watts per square meter. For many commercial purposes, the desired electrical output is obtained by housing a plurality of panels in a module similar to the arrangement disclosed in U.S. Pat. No. 4,233,085.

Figure 2:
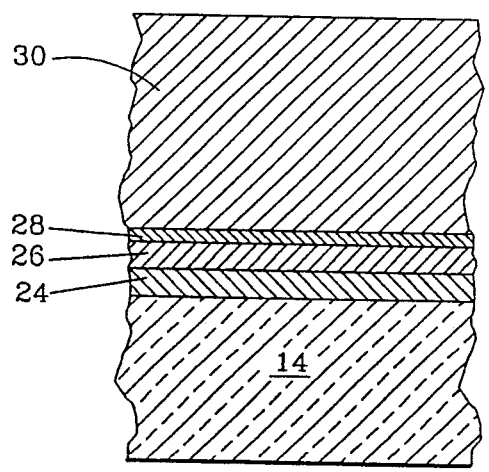
FIG. 2 is a cross-sectional view of a panel depicting various layers applied over a glass substrate according to the present invention prior to regrowth of the active photovoltaic layers.

FIG. 2 depicts in cross-section a panel prior to regrowth (crystallization) of the active photovoltaic layers. It should be understood that the thickness of each of the applied layers as shown in FIGS. 2 and 3 is approximately to scale with respect to the other depicted layers, but not with respect to the glass substrate 14. During the first step of constructing the photovoltaic panel, a bottom electrod may be formed on the substrate, with the electrode itself consisting of a bottom continuous electrode layer 24 having a high conductivity, and a top electrod layer 26 having a comparatively low conductivity. Each of these layers may be formed from a tin oxide solution utilizing spray pyrolysis techniques disclosed in the previously-cited prior art. The desired conductivity of these layers may be varied and, within reasonable limits, easily controlled by adjusting the amount of zinc or cadmium which is added to the tin oxide spray solution. Since the panel particularly described herein is of a backwall configuration, light must pass both through the glass substrate and the layers 24, 26 before reaching the junction formed by the active photovoltaic layers. High transmissivity of these tin oxide layers can nevertheless be maintained while changing the conductivity of these layers by a factor of approximately six orders of magnitude.

The bottom tin oxide layer 24 serves the primary purpose of passing electrical energy through the cell and interconnecting the cell in a series arrangement, and thus should have a high conductivity. Preferably the layer 24 has a conductivity of more than 1000 mho/cm, and most preferably more than 2200 mho/cm. Using prior art techniques, a highly conductive yet highly transmissive tin oxide layer has been generated having a specific conductivity of 3700 mho/cm, so that obtaining a tin oxide layer with a specific conductivity of approximately 2200 mho/cm is feasible on a commercial basis. For reasons explained subsequently, the top tin oxide layer 26 must have low conductivity, should be thin, and also must have a high degree of continuity (few pinholes or flaws in layer 26 are permissible). High continuity of this layer may be obtained utilizing a low molarity tin oxide spray solution for the spray pyrolysis process. The specific conductivity of the upper tin oxide layer preferably is in the range from approximately $1.25 \times 10^{-3}$ to 100 mho/cm. The thickness of the lower tin oxide layer is not particularly critical, but is preferably in the range 0.4 to 1.0 microns. The thickness of the upper tin oxide layer may be from approximately 0.1 to approximately 1.0 microns and, as previously noted, is doped with a suitable metal such as cadmium or zinc to produce low carrier concentration.

Once the tin oxide layers have been formed, a relatively continuous layer 28 of CdS may be applied utilizing spray pyrolysis. The thickness of the deposited CdS layer may be in the range of from approximately 2,000 Å to 12,000 Å (0.2 to 1.2 microns), and this layer also has high degree of continuity (few pinholes). A fairly thick CdTe layer 30 may then be applied on the CdS layer, with the thickness of layer 30 being substantially greater than that of the CdS layer 28. The CdTe layer may be economically formed using the atmospheric temperature spray and compression technique disclosed in U.S. Pat. No. 4,375,909. It should be understood that various techniques may be used for applying any of the layers 24, 26, 28 and 30, including spray pyrolysis, dip coating, or gas deposition. The preferred deposition technique has low cost deposition equipment and thus low manufacturing costs, and will result in continuous, thin, and thus relatively inexpensive layers.

As shown in FIG. 2, the layers 28, 30 as applied have relatively small crystals (not shown), which is undesirable for high photovoltaic efficiency. To increase the conversion efficiency, these layers are regrown at a temperature in excess of 400° C., and preferably from approximately 520° C. to approximately 550° C., to form substantially large crystals as shown in FIG. 3. Individual lower crystals 36A, 36B, 36C, and 36D in the regrown CdTe layer have dimensions approximating 2 microns, while the total thickness of the regrown layer 44 is typically approximately 6 microns. The smaller CdTe crystals are generally toward the upper portion of layer 44. Alternatively, the CdTe crystals could have a thickness approximating that of the layer itself, which is likely an achievable goal. Regrowth occurs at a temperature and during a time interval sufficient to cause substantial interdiffusion between the CdS and the CdTe layers and the CdS is also believed to migrate into the CdTe layer, and particularly in the interstices between the large diameter CdTe crystals. The term effective thickness, as used herein, is intended to mean its apparent thickness as defined by its transmissivity of short wavelength sunlight, i.e., wavelengths below 520 nm. As an example, using an absorptivity coefficient of CdS of $10^5$/cm, a CdS layer having an actual uniform thickness of 3,500 Å may pass less than approximately 3% of sunlight having a wavelength less than 520 nm, while a CdS layer having an actual thickness of approximately 200 Å may pass more than 92% of this low wavelength energy. The photovoltaic cell formed according to the techniques of the present invention has an efficiency with respect to such short wavelength energy which would be equivalent to a device having a very thin CdS layer, and accordingly it is convenient to discuss the effective thickness of the CdS layer. As exemplified in FIG. 3, it is believed that the actual thickness of portion 32 of the CdS layer between the bottom of a CdTe crystal and the top of the low conductivity tin oxide layer 26 is substantially minimized, and it is also believed that the CdS tends to diffuse away from the tin oxide layer and partially enters the cadmium telluride crystals, occupies a portion of the voids between CdTe crystals, and deposits on CdTe grain surfaces. This diffusion or migration of the CdS is generally in the lower portion of the CdTe layer, and some voids 48 generally will still exist between CdTe crystals, with diffused CdS "surrounding" these voids and adjoining the CdTe grain boundaries. The effective thickness of the CdS layer and the tin oxide layer is substantially reduced by the interdiffusion of CdTe and CdS and the "transfer" of CdS onto CdTe grains. FIG. 3 thus represents the presumed flow of CdS material during regrowth, with some of the CdS material migrating upward to deposit an CdTe crystal surfaces or form irregular upwardly extending walls 34 of CdS material between CdTe crystals, while some of the CdS material may form a relatively thin, generally planar layer 32 between the bottom of individual CdTe crystals and the top of the layer 26. During regrowth, some of the CdS material also may diffuse into the CdTe crystals and some CdTe may likewise diffuse into the CdS material. This diffusion and/or interdiffusion also may result in the desired substantial reduction in the effective thickness of the CdS layer.

The significant reduction of the effective thickness of the CdS layer during the regrowth of the active photovoltaic layers can be exemplified by noting that the CdS layer 28 in FIG. 2 prior to regrowth has an effective thickness of from 2,000 to 10,000 Å, while the effective thickness of the CdS layer 32 after regrowth as shown in FIG. 3 is preferably in the range of from approximately 100 to approximately 500 Å. Accordingly, the effective thickness of the CdS layer has been reduced during regrowth so that its thickness subsequent to regrowth is approximately 1/20th or less of its thickness prior to regrowth. This substantial reduction in effective thickness of the CdS layer is thus a primary reason for the substantial increase in photovoltaic efficiency, since the thin CdS layer is able to pass short wavelength light (less than 520 nm) to the junction, while the comparatively thick CdS layer absorbed and wasted that short wavelength energy as heat.

In the middle of the blue response region of photovoltaic devices, e.g., 450 nm, cells using relatively thick CdS layers (with absorptivities of $10^5$/cm) have less than 3% quantum efficiency at that wavelength. Cells according to the present invention, however, have a quantum efficiency at the same wavelength of from 60 up to 80% at that wavelength. While an extremely thin CdS layer is desired to pass this low wavelength energy, the average effective thickness of the CdS layer must be sufficient to minimize the number of pinholes or flaws in this layer, and must also be sufficient to form a reasonable junction with the CdTe crystals. According to the present invention, the effective thickness of the CdS layer may be uniformly reduced to less than 500 Å by diffusing a great deal of the material from this layer into the CdTe layer 44, during regrowth, and at least some of this material migrates to enter the gaps between the CdTe crystals.

If the CdS is deposited by spray pyrolysis, the quantum efficiency of the regrown cell decreases slightly with an increase in as-deposited CdS effective thickness greater than 2,000 Å. In one experimental program, an as-deposited CdS layer effective thickness from 5,000 to 6,000 Å nevertheless results in quantum efficiency in excess of 70% at 450 nm on a finished device. While the effective thickness of the CdS layer subsequent to regrowth may thus be reduced to approximately 1/20th of its as-applied thickness, a slightly greater or slightly less effective thickness reduction may occur. In any event, however, the effective thickness of the CdS layer will be significantly reduced during regrowth, and preferably will be reduced to an effective thickness less than approximately 10% of its as-applied thickness, and most preferably will be reduced to approximately 500 Å or less. The addition of cadmium chloride as a flux in the CdTe layer during regrowth may be important for large diameter crystal formation. It is also noted that generation of hot halogen-containing gases during regrowth is important for acceleration of the interdiffusion of the CdS and CdTe.

Due in large part to the substantially reduced effective thickness of the CdS layer, it is possible that some pinholes or other flaws in the applied CdS layer may occur. If a conventional conductor layer adjoins the CdS layer, a pinhole in the CdS layer will result in a short between the CdTe layer and the conductor layer, thereby destroying the energy producing effect of the cell. According to the present invention, such shorting is avoided by applying two dissimilar tin oxide layers, with the layer adjoining the CdS layer being the relatively low conductivity layer. Due to the special nature of this layer, a pinhole in the CdS layer will not result in shorting of the cells, but rather, it will actually produce power due to the heterojunction formed between the cadmium telluride and the low conductivity tin oxide. Since this low conductivity (high resistivity) tin oxide layer is thin, preferably less than about 8000 Å, and since current passes in a direction normal or perpendicular to the plane of this layer, the low conductivity of this layer adds little series resistance to the overall panel. Current flow in the high conductivity tin oxide layer moves in a direction generally parallel to the plane of this layer, and high conductivity for the bottom tin oxide layer is essential to achieve high efficiency.

It has been determined that, by properly doping the top tin oxide layer with zinc or other suitable metal, the electron carrier density of this level may be adjusted to be compatible with the presumed electron carrier density of the p-type layer, in this case the CdTe layer. Adjusting the electron carrier density of the upper tin oxide layer by adding a suitable metal also affects the resistivity of this layer, and to a much lesser amount affects transmissivity. Accordingly, a reasonable tradeoff must be made between the desire to achieve the desired carrier density for this layer, at the same time ensuring that this layer has high transmissivity and the desired resistivity. Nevertheless, it is possible to obtain high transmissivity for this layer, achieve the desired specific conductivity in the range of from $1.25 \times 10^{-3}$ to 100 mho/cm, and simultaneously obtain an electron carrier density for this layer which preferably is adjusted to be within the range of approximately two to three orders of magnitude of the known or presumed hole carrier density for the CdTe layer. By making the carrier density of the top tin oxide layer compatible with the p-type layer (within at least two or three orders of magnitude), any reasonable flaws in the CdS layer would not result in short-circuiting of the cell for reasons previously noted, but rather an energy-producing junction is formed by the CdTe layer and the top tin oxide layer. If the adjusted electron carrier density of the top tin oxide layer is too low relative to the carrier density of the CdTe layer, the junction formed with the tin oxide layer is undesirably shallow within the CdTe crystals, thereby resulting in low open-circuit voltage for that small contact area between the CdTe and the high resistivity tin oxide layer. On the other hand, if the electron carrier density of the tin oxide layer is undesirably high relative to that of the CdS layer, the junction formed in the CdTe crystals is too deep, thereby resulting in low short circuit current and an unsatisfactory junction. Nevertheless, a reasonably efficient junction may be obtained between the CdTe layer and a tin oxide layer doped with a suitable metal. While it is preferred to form a cell according to the present invention so that a very thin CdS layer capable of passing low wavelength sunlight is obtained, flaws in such a CdS layer will not destroy the cell for the reasons noted above, and accordingly extreme quality control procedures for applying and for regrowing crystals in this layer are not required. Also, it should be understood that it is possible to entirely eliminate the CdS layer and form a suitable photovoltaic cell, so that the bottom tin oxide layer acts as a conductor, the top tin oxide layer acts as the n-type layer (heterojunction partner), and cadmium telluride or other suitable material acts as the p-type layer.

As a further explanation of the latter embodiment described above, it is recognized that the cost of producing photovoltaic modules has been a major limitation to large-scale terrestrial use of photovoltaics as an energy source. The low-cost production of photovoltaics is primarily a function of reducing the cost of materials used, reducing the cost of deposition equipment for applying the active film layers, the simplicity of design of the active layers and the module itself, and a lack of sensitivity to process variations as a function of the materials and the design utilized. Each additional material present in the photovoltaic device adds to the complexity and therefore the cost of the device. A number of materials can conceivably be matched to a given absorber layer (typically the p-type layer) by adjusting the relative ratio of electron or hole carrier concentration contained in each of the p-type and n-type layers. The function of practically adjusting the carrier density of the junction partner layer (typically the n-type layer) often includes complexities which add significantly to the cost of the depostion.

According to this invention, the method of adjusting the carrier concentration of a tin oxide layer is disclosed. The carrier concentration is related to the specific resistivity which may be adjusted by over seven orders of magnitude by changing the amount and type of dopant added to the tin oxide solution, which may be sprayed on top of the heated substrate (glass). The reliability of manufacturing according to this technique is simplified since the base material for each of the various tin oxide layers need not be significantly changed and the deposition technique need not change. The carrier concentration of the tin oxide layer may thus be matched to any of various p-type absorber layers, thus eliminating the requirement of a separate CdS layer, and thus reducing the cost of the photovoltaic modules.

Figure 4:
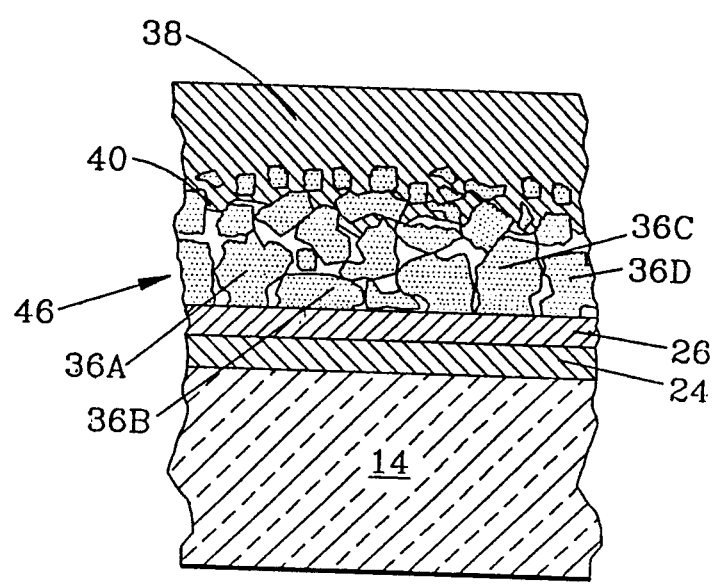
FIG. 4 is a cross-sectional view of an alternate embodiment photovoltaic panel subsequent to regrowth and prior to dividing and series interconnection.

FIG. 4 illustrates in cross-section a photovoltaic cell according to this latter invention. The glass substrate and conductive layers 24 and 26 are as previously described. Preferably substantially the same conductive material composition is used to form both layers 24 and 26, with the selected material forming a transparent, conducting layer with suitable characteristics, and preferably being from a group consisting of tin oxide, zinc oxide, indium tin oxide, and cadmium stannate. More particularly, this selected material for the layer 24 should be highly conductive, while at the same time this material can be doped to form a layer 26 which acts as a heterojunction partner and a window layer for the photovoltaic cell. For purposes of explanation, this discussion assumes that the material for the p-type layer will be cadmium telluride, although various compounds may be used to form the p-type layer, and exemplary alternatives are discussed below. Also for purposes of explanation, the layer 26 may be doped with cadmium or zinc to reduce the conductivity of this layer and result in the desired n-type material, although lead, mercury, selenium, sulfur, sodium, cesium, mecury, boron, and chromium may be alternative doping materials.

The photovoltaic panel as shown in FIG. 4 thus comprises a substantially continuous conductive layer 24 of tin oxide for electrically interconnecting the pluarlity of cells, and a polycrystalling tin oxide layer 26 being applied on layer 24 and doped with a selected amount of a desired dopant. A polycrystalline p-type layer 46 is then formed on the layer 26 with the cadmium telluride crystals of layer 46 being of the form and size previously described. The top electrode layer 38 as shown in FIG. 3 is applied over the cadmium telluride layer, and may migrate down into the porous CdTe layer 46 with no significant adverse affect. A spacing between the lowermost migrated of layer 38 and the uppermost migrated n-type material is preferred, as shown in FIG. 3, with is spacing being occupied by CdTe crystals and voids between the crystals. For the embodiment as shown in FIG. 4, the migrating material of layer 38 does not contact the tin oxide layer 26, and again voids occur between the CdTe crystals and between this migrating material and the tin oxide layer 26. Sunlight thus passes through the substrate 14 and the layer 24 to reach the junction formed by the n-type layer 26 and the p-type layer 46. Preferably both the layers 24 and 26 are deposited by the same process to reduce manufacturing costs and improve quality control, and spray pyrolsis is one suitable process for depositing both the conductive tin oxide layer 24 and the doped tin oxide layer 26.

According to the method of this invention, a photovoltaic panel including a plurality of photovoltaic cells may be formed on a common substrate by selecting a material for the conductive polycrystalline film layer 24, then depositing this selected material by spray pyrolysis or another technique on the substrate to form a substantially continuous optically transmissive conductive layer for electrically interconnecting the plurality of photovoltaic cells. The p-type material for forming the photovoltaic heterojunction is selected, and the presumed carrier density or approximate carrier density of the p-type layer is known. Substantially the same material used to form the layer 24 may then be selectively doped to form the n-type layer, with the amount of dopant being a function of the presumed carrier density of the p-type photovoltaic layer. The high conductivity layer 24 may consist of tin oxide and a small amount of fluorine, which may be added to the tin oxide material for layer 24 to enhance conductivity. Although a differnt dopant is added to the tin oxide material for layer 26, the material for forming both layers 24 and 26 prior to adding the dopant is substantially the same, e.g., tin oxide. This doped material may then be deposited by spray pyrolysis on the conductive thin film layer 24 to form an n-type polycrystalline thin film layer for the photovoltaic cells, and finally the selected p-type material may be deposited on the n-type material to form a p-type photovoltaic layer and the junction with the n-type layer. Once a panel as shown in FIG. 4 is formed by this technique, the large photovoltaic cell may be divided to form a plurality of photovoltaic cells in the manner described in the prior art, and the divided photovoltaic cells then interconnected to form a photovoltaic panel Tin oxide is a preferred material for achieving the above purposes due to its high transparency and dopability to achieve a wide range of resistivity. Other materials may, however, be used. Zinc oxide is one alternative and, although its extinction coefficient is smaller than that for tin oxide, its specific resistivity is considerably higher. The large electron density of tin oxide, generally greater than about $10^{20}/cm^3$, prevents its use as a junction material with every potential semi-conductor partner layer. Cadmium telluride may form the p-type layer for such a photovoltaic cell, since its carrier density can be approximately $10^{16}/cm^3$. The cell formed from these layers can thus be expected to have a low open-circuit voltage and/or unsatisfactory short-circuit current. By doping the tin oxide layer, however, a jundtion may be produced with the cadmium telluride layer which results in a reasonable voltage, current, and fill factor. The uniform continuity of the low carrier concentration density tin oxide layer is necessary to avoid shorts, while at the same time this tin oxide layer must remain thin, and preferably less than about 8,000 Å, to prevent unnecessary optical absorption. These objectives can be achieved by applying this layer with spray pyrolysis utilizing a large number of low molarity droplets to consistently and completely cover the low resistance tin oxide layer and thereby prevent low resistance shunt paths.

It should also be understood that the p-material layer may be formed from materials other than CdTe. According to the above technique, an inexpensive copper indium diselenide cell may be formed with the n-type material being a doped tin oxide layer formed by spray pyrolysis. A similar cell may be formed utilizing copper sulfide, copper indium disulfide or copper indium diselenide as the p-type material. Other cells which may be formed according to this invention include cells having a p-type semi-conductor layer of either polycrystalline silicon, aluminum antimomide, gallium arsenide, or indium phosphide.

According to the method of the present invention, the effective thickness of the n-type material layer is reduced so that at least a substantial amount of sunlight, i.e., at least 25%, and preferably at least 50%, having a wavelength with an energy higher than the bandgap of the n-type material for this layer (short wavelength light) passes through this reduced effective thickness n-type layer to be absorbed by the photovoltaic heterojunction. Since the n-type layer must be physically thin, flaws or holes in this otherwise continuous layer can be expected. According to a preferred embodiment of this invention, the p-type layer forms a desired photovoltaic junction with this thin n-type layer, and also forms a photovoltaic junction with the conductive layer 26 where flaws occur in the n-type layer. This latter junction has a reasonably high efficiency due to the doping at this layer 26, so that its electron carrier density is within at least three orders of magnitude of the known or presumed carrier density of the p-type material. In order to prevent shorts in the cell, the specific conductivity of this layer 26 is also maintained within the range previously described.

Once a panel has been regrown in a manner which results in layers 24, 26, 32 and 36 as shown in FIG. 3, or 24, 26 and 46 as shown in FIG. 4, the panel may be divided and series interconnected according to prior art techniques. Using either a mechanical cutter or a laser, a thin strip of applied layers may be removed down to the glass substrate, and a portion of the thin elongate gap formed by this operation filled with a suitable insulating film to cut the electrical connection between the bottom electrode layers 24 of adjacent cells. A desired electrode strip may be formed on an edge portion of the bottom tin oxide layer. Either prior or subsequent to this operation, a top electrode layer 38 as shown in FIG. 3 may be deposited over the CdTe layer, with some of this layer 38 optionally filling the upper portion of gaps between the CdTe crystals. Accordingly, the top electrode layer 38 may include downwardly projecting walls 40 which preferably do not come into contact with the upwardly projecting walls 34 of the CdS layer. Various materials may be used for the layer 38, and it is presently preferred that the layer be formed by a graphite paste process, thereby achieving relatively low material and deposition cost. The series interconnection of the cells may then be formed by depositing a conductive electrode layer on top of layer 38, with the conductive electrode layer filling part of the gap formed by the cell division technique and forming a reliable electrical connection between the top electrode of one cell and the bottom electrode of an adjacent cell. The completed cell may then be encapsulated according to techniques described in patents previously noted. Any of the layers 24, 26 or 44, 46 may thus include a narrow elongate cut to divide the panel into individual cells and to series interconnect the cells. Each of these layers is nevertheless deposited as and remains a substantially continuous layer, thereby resulting in comparatively low manufacturing costs.

While tin oxide is a preferred material for each of the high conductivity and low conductivity layers of a cell according to the present invention due to its high transmissivity and ability to easily adjust its carrier concentration, other materials may be used to form this bottom electrode. A zinc oxide layer may form this conductor layer, and is particularly well suited for forming the low conductivity layer. The material used to dope the conductor and adjust its carrier density and resistivity should not substantially affect the high transmissivity of this layer, and zinc, indium, gallium, and aluminum are a suitable doping metal for this purpose. Other dopants may also be used. While the tin oxide layers may be formed according to spray pyrolysis techniques, the invention is not limited to using spray pyrolysis to form the conductor layers. Also, it should be understood that while the bottom conductor layer as described herein consist of the bottom high conductivity tin oxide layer and a substantially increased resistivity top tin oxide layer, the conductivity of the conductor layer may change gradually from the bottom to the top of the conductor layer, so that two distinct layers are not formed but rather a gradual change in conductivity of the tin oxide layer occurs as one moves up through the thickness of the layer. The prospect of gradually changing the conductivity of this layer is not difficult to obtain when panels are formed on a mass production basis, since the glass substrate may be moved over a series of spray nozzles each having an increasing or decreasing amount of added metal as a dopant.

As previously noted, high continutiy of the tin oxide layer adjoining the CdS layer is essential, and this high continuity can be obtained by reducing the molarity of the tin oxide solution which form this upper layer, and increasing the deposition time and thus the number of droplets reaching the substrate. While no precise molarity for forming this uppermost tin oxide layer is critical, the molarity of the solution forming the uppermost tin oxide layer typically will be less than 0.5 moles/liter, and frequently in the range of about 0.2 moles/liter or less. While the techniques of the present invention are particularly well-suited for forming a high efficiency CdS/CdTe photovoltaic cell, it should be understood that the concepts of the present invention are not limited to use of these chemical layers for either the p-type or the n-type material. In particular, it should be understood that substantially increased efficiency of a photovoltaic device is formed according to the present invention by obtaining an n-type material layer which has a substantially reduced effective thickness compared to its as-deposited thickness, and that this n-type layer is obtained by simultaneously heating the p-type material and the n-type material layer to substantially increase the size of the crystals in each of these layers while simultaneously diffusing and interdiffusing the n-type and the p-type layers.

A complete understanding of the mechanical and chemical functions occurring during the substantial reduction in the effective thickness of the CdS layer (or other n-type layer highly transmissive of sunlight) is not yet fully understood. This reduction in effective thickness is primarily believed to be due to diffusion, interdiffusion, and/or migration of CdS material into the CdTe (or other p-type material) layer, with CdS material entering the voids between the regrown CdTe crystals and depositing on the available CdTe surfaces. The term "diffusion" as used herein with respect to the action occurring during the reduction in the effective thickness of the n-type layer should be understood to encompass conventional diffusion, as well as interdiffusion and migration into the p-type layer. Also, those skilled in the art will appreciate that while diffusion of the n-type layer into the p-type layer will reduce the effective thickness of the n-type layer, as explained above, this action can also be similarly described as diffusion of the p-type layer into the n-type layer. The key is the desired effective reduction in the thickness of the n-type layer which occurs during heating, not the specific mechanical and/or chemical function which causes this reduction. Another benefit of this CdS "diffusion" action is that the n-type material tends to cover a substantially higher portion of the CdTe grain surfaces than would occur during a planar interface of two layers. Also, it should be understood that the benefit of passing short wavelength light to the junction will occur regardless of the selected n-type material, and that the earlier reference to passing light less than 520 nm is based on the bandgap of CdS, which is approximately 520 nm. The bandgap of various materials suitable for forming the n-type layer is well known, and energy bandgaps for various materials can be easily calculated from minimum room temperature energy gap values published in available handbooks, such as *CRC HANDBOOK OF CHEMISTRY & PHYSICS*, 58th Edition. The present invention thus envisions the significant reduction in the effective thickness of the n-type material layer by "diffusion" into the p-type layer, such that a majority of sunlight energy having a wavelength with an energy higher than the bandgap of the selected n-type material passes through the reduced thickness n-type layer to react with the photovoltaic junction.

While the invention has thus been described in terms of specific embodiments which are set forth in detail, it should be understood that this discussion and the drawings which form a part of this disclosure should not be understood as limiting this invention. Various alternative embodiments and operating techniques will become apparent to those skilled in the art in view of this disclosure. The invention should thus be understood to include various embodiments not described herein, and the invention is limited only by reasonable construction of the claims attached hereto in view of this disclosure.

What is claimed is:

1. A method of manufacturing a photovoltaic panel including a plurality of photovoltaic cells each formed on a common substrate, the method comprising:
   selecting a material for forming a conductive and substantially transparent polycrystalline thin film layer;
   depositing the selected material on the substrate to form a substantially continuous conductive and substantially transparent polycrystalline thin film layer for electrically interconnecting the plurality of photovoltaic cells;
   selecting a p-type material for forming a p type thin film layer having a presumed carrier density;
   selectively doping an n-type oxide material to produce a doped n-type oxide material that (a) has a resistivity sufficient to reduce electrical shorting between said p-type material and said substantially continuous, conductive and substantially transparent polycrystalline thin film layer and (b) has a sufficient electron carrier density to form a power-producing heterojunction with said p-type material;
   depositing the doped n-type oxide material on the substrate to physically engage the substantially continuous, conductive and substantially transparent polycrystalline thin film layer and form a doped n-type substantially transparent polycrystalline thin film layer for the plurality of photovoltaic cells; and
   depositing the selected p-type material on the substrate to form a p-type thin film layer for the plurality of photovoltaic cells that operatively engages the doped n-type substantially transparent polycrystalline thin film layer to form a photovoltaic heterojunction therewith.

2. The method as defined in claim 1, wherein the material selected for the conductive and substantially transparent polycrystalline thin film layer is selected from a group consisting of tin oxide, zinc oxide, indium tin oxide, and cadmium stannate, and the substantially continuous, conductive and substantially transparent polycrystalline thin film layer and the doped n-type substantially transparent polycrystalline thin film layer are deposited on the substrate by the same process.

3. The method as defined in claim 2, wherein the material selected for the conductive and substantially transparent polycrystalline thin film layer comprises tin oxide, and the n-type oxide material comprises tin oxide.

4. The method as defined in claim 3, wherein the dopant for said n-type oxide material is selected from a group consisting of zinc, cadmium, boron, cesium, chromium, and mercury.

5. The method as defined in claim 1, wherein the material selected for the conductive and substantially transparent polycrystalline thin film layer is substantially the n-type oxide material prior to said step of selectively doping, and the substantially continuous, conductive and substantially transparent polycrystalline thin film layer and the doped n type substantially transparent polycrystalline thin film layer are deposited on the substrate by the same process.

6. The method as defined in claim 5, further comprising:
substantially uniformly varying an amount of dopant added to the material selected for the conductive and substantially transparent polycrystalline thin film layer, such that the amount of dopant in the selected material directly alters the carrier density between the substantially continuous, conductive and substantially transparent polycrystalline thin film layer and the doped n-type substantially transparent polycrystalline thin film layer.

7. The method as defined in claim 1, wherein the selected p-type material is selected from a group consisting of copper indium diselenide, copper sulfide, cadmium telluride, silicon, cadmium arsenide, indium phosphide, and aluminum antimonide.

8. The method as defined in claim 7, wherein the selected p-type material for forming the p type thin film layer includes cadmium.

9. The method as defined in claim 1, wherein:
the doped n-type oxide material is deposited ubsequent to the substantially continuous, conductive, and substantially transparent polycrystalline thin film layer and prior to the p-type thin film layer, such that the substantially continuous, conductive and substantially transparent polycrystalline thin film layer is in physical engagement with the substrate.

10. The method as defined in claim 1, wherein said material for forming said conductive and substantially transparent polycrystalline thin film layer is substantially said n type oxide material prior to said step of selectively doping;
said step of depositing the selected material for forming said substantially continuous, conductive and substantially transparent polycrystalline thin film layer includes doping said selected material to obtain a higher conductivity; and
said step of selectively doping said n-type oxide material includes doping said n-type oxide material to obtain a lower conductivity than said n-type oxide material had prior to said step of selectively doping.

11. The method as defined in claim 1, wherein said substantially continuous, conductive and substantially transparent polycrystalline thin film layer has a conductivity from about 1000 to about 5000 mho/cm and said doped n-type substantially transparent polycrystalline thin film layer has a conductivity from about $1.25 \times 10^{-3}$ to about 100 mho/cm.

12. The method as defined in claim 1, wherein the amount of dopant contributes to a carrier density of the doped n-type material within three orders of magnitude of a presumed carrier density of the p-type material.

13. A photovoltaic cell, comprising:
a substantially continuous, conductive and substantially transparent layer of a selected material for electrically interconnecting a plurality of said photovoltaic cells, the substantially continuous, conductive and substantially transparent layer being selected from a group consisting of tin oxide, zinc oxide, indium tin oxide, and cadmium stannate;
a substantially continuous n-type polycrystalline layer adjoining the substantially continuous, conductive and substantially transparent layer, the substantially continuous n-type polycrystalline layer consisting substantially of the selected material for the substantially continuous, conductive and substantially transparent layer but doped differently from said substantially continuous, conductive and substantially transparent layer and with an amount of dopant such that (a) said substantially continuous n-type polycrystalline layer has a resistivity sufficient to reduce electrical shorting between said substantially continuous, conductive and substantially transparent layer and a substantially continuous p-type polycrystalline layer and (b) said substantially continuous n-type polycrystalline layer has a sufficient electron carrier density to form a power-producing heterojunction with a p type polycrystalline layer; and
a substantially continuous p-type polycrystalline layer adjoining the substantially continuous n-type polycrystalline layer to form a power-producing heterojunction therewith, the substantially continuous p-type polycrystalline layer being selected from a group consisting of copper indium diselenide, copper sulfide, cadmium telluride, silicon, cadmium arsenide, indium phosphide, and aluminum antimonide.

14. The cell as defined in claim 13, wherein the amount of dopant produces a carrier density of the substantially continuous n-type polycrystalline layer with three orders of magnitude of the presumed carrier density of the substantially continuous p-type polycrystalline layer.

15. A photovoltaic panel comprising a plurality of photovoltaic cells formed on a common substrate, comprising:
a substantially continuous, conductive and substantially transparent layer of a selected material for electrically interconnecting the plurality of photovoltaic cells;
a substantially continuous n-type polycrystalline layer adjoining the conductive layer; and
a substantially continuous p-type polycrystalline layer adjoining the n-type layer and having a substantially uniform electron carrier density;
wherein said substantially continuous n-type polycrystalline layer comprises an oxide material doped with a dopant such that (a) said substantially continuous n-type polycrystalline layer has a resistivity sufficient to reduce electrical shorting between said substantially continuous, conductive and substantially transparent layer and said substantially continuous p-type polycrystalline layer and (b) said substantially continuous n-type polycrystalline layer has a sufficient electron carrier density to form a power-producing heterojunction with said substantially continuous p-type polycrystalline layer.

16. The photovoltaic panel as defined in claim 15, wherein both the substantially continuous, conductive and substantially transparent layer and the substantially continuous n-type polycrystalline layer are selected from a group consisting of tin oxide, zinc oxide, indium tin oxide, and cadmium stannate.

17. The photovoltaic panel as defined in claim 16, wherein the substantially continuous n-type polycrystalline layer comprises the selected material for the substantially continuous, conductive and substantially transparent layer and said dopant.

18. The photovoltaic panel as defined in claim 16, where the substantially continuous, conductive and substantially transparent layer consists essentially of tin oxide.

19. A photovoltaic panel as defined in claim 16, wherein the dopant in the substantially continuous n type polycrystalline layer is selected from a group consisting of zinc and cadmium.

20. The photovoltaic panel as defined in claim 15, wherein the substantially continuous, conductive and substantially transparent layer includes less of said dopant than the substantially continuous n-type polycrystalline layer.

21. The photovoltaic panel as defined in claim 15, wherein both the substantially continuous, conductive and substantially transparent layer and the substantially continuous n-type polycrystalline layer are optically transmissive of sunlight, such that sunlight passes through the substantially continuous, conductive and substantially transparent layer and the substantially continuous n-type polycrystalline layer to reach the substantially continuous p-type polycrystalline layer.

22. The photovoltaic panel as defined in claim 15, wherein the substantially continuous p-type polycrystalline layer is selected from a group consisting of copper indium diselenide, copper sulfide, cadmium telluride, silicon, cadmium arsenide, indium phosphide, and aluminum antimonide.

23. The photovoltaic panel as defined in claim 22, wherein the substantially continuous p-type polycrystalline layer is cadmium telluride.

24. The photovoltaic panel as defined in claim 15, wherein the substantially continuous, conductive and substantially transparent layer is formed on a vitreous substrate.

25. The panel as defined in claim 15, wherein the amount of dopant produces a carrier density of the substantially continuous n-type polycrystalline layer within three orders of magnitude of the presumed carrier density of the substantially continuous p-type polycrystalline layer.

* * * * *